(12) United States Patent
Matsushima et al.

(10) Patent No.: US 11,768,416 B2
(45) Date of Patent: Sep. 26, 2023

(54) DISPLAY DEVICE

(71) Applicant: Japan Display Inc., Tokyo (JP)

(72) Inventors: Toshiharu Matsushima, Tokyo (JP); Jin Hirosawa, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/073,594

(22) Filed: Dec. 2, 2022

(65) Prior Publication Data
US 2023/0194941 A1    Jun. 22, 2023

(30) Foreign Application Priority Data
Dec. 22, 2021 (JP) .................. 2021-208476

(51) Int. Cl.
| | | |
|---|---|---|
| *G02F 1/1335* | (2006.01) | |
| *G02F 1/1362* | (2006.01) | |
| *H01L 27/12* | (2006.01) | |
| *G02F 1/1343* | (2006.01) | |
| *G02F 1/1368* | (2006.01) | |

(52) U.S. Cl.
CPC .. *G02F 1/136286* (2013.01); *G02F 1/134345* (2021.01); *G02F 1/136227* (2013.01); *H01L 27/124* (2013.01); *G02F 1/1368* (2013.01); *G02F 1/133514* (2013.01); *G02F 2202/16* (2013.01); *G02F 2203/01* (2013.01)

(58) Field of Classification Search
CPC ......... G02F 1/134345; G02F 1/136213; G02F 1/133512; G02F 1/133514; G02F 1/1368; G02F 2203/01; H01L 27/124
See application file for complete search history.

(56) References Cited

U.S. PATENT DOCUMENTS

| | | | | |
|---|---|---|---|---|
| 2001/0010567 A1* | 8/2001 | Rho | ................. | G02F 1/133345 349/44 |
| 2012/0249901 A1* | 10/2012 | Sekine | ................. | H04N 13/324 349/15 |
| 2013/0107182 A1* | 5/2013 | Hagiwara | ......... | G02F 1/133707 349/110 |
| 2014/0036179 A1* | 2/2014 | Huang | ............. | G02F 1/133512 349/33 |
| 2019/0056620 A1* | 2/2019 | Akiyoshi | ............. | H01L 27/124 |

FOREIGN PATENT DOCUMENTS

| | | |
|---|---|---|
| JP | H11-126026 A | 5/1999 |
| JP | 2019-035884 A | 3/2019 |

* cited by examiner

*Primary Examiner* — James A Dudek
(74) *Attorney, Agent, or Firm* — XSENSUS LLP

(57) ABSTRACT

According to one embodiment, a display device includes an insulating substrate having a main surface, a switching element, a first pixel electrode electrically connected to the switching element, a second pixel electrode adjacent to the first pixel electrode, a wiring line provided between the first pixel electrode and the second pixel electrode, a convex portion provided between the wiring line and a liquid crystal layer, overlapping the wiring line and extending along the wiring line, and a black film formed into a belt-like shape overlapping the convex portion and having an inclined surface which inclines with respect to the main surface.

14 Claims, 14 Drawing Sheets

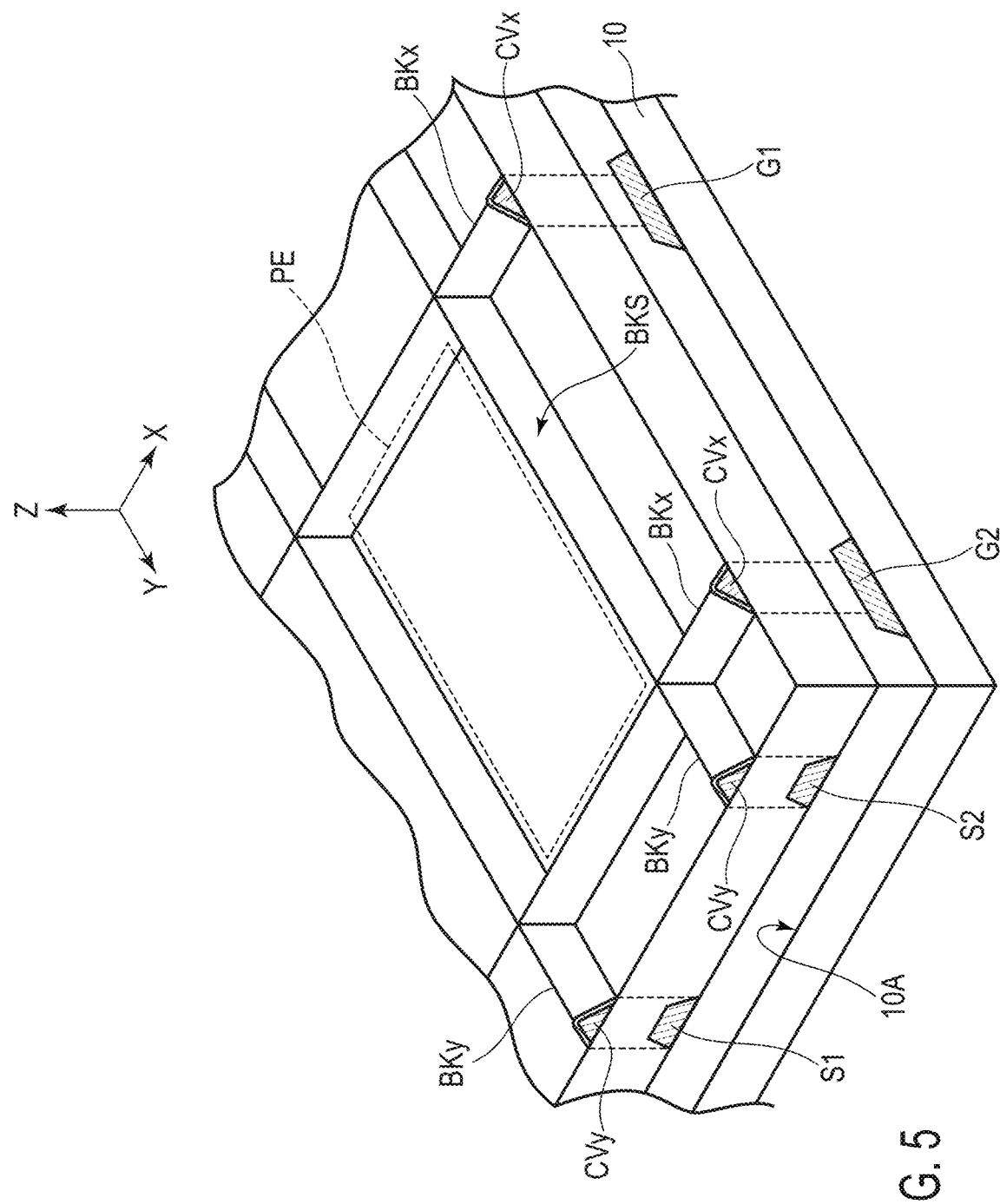
F I G. 5

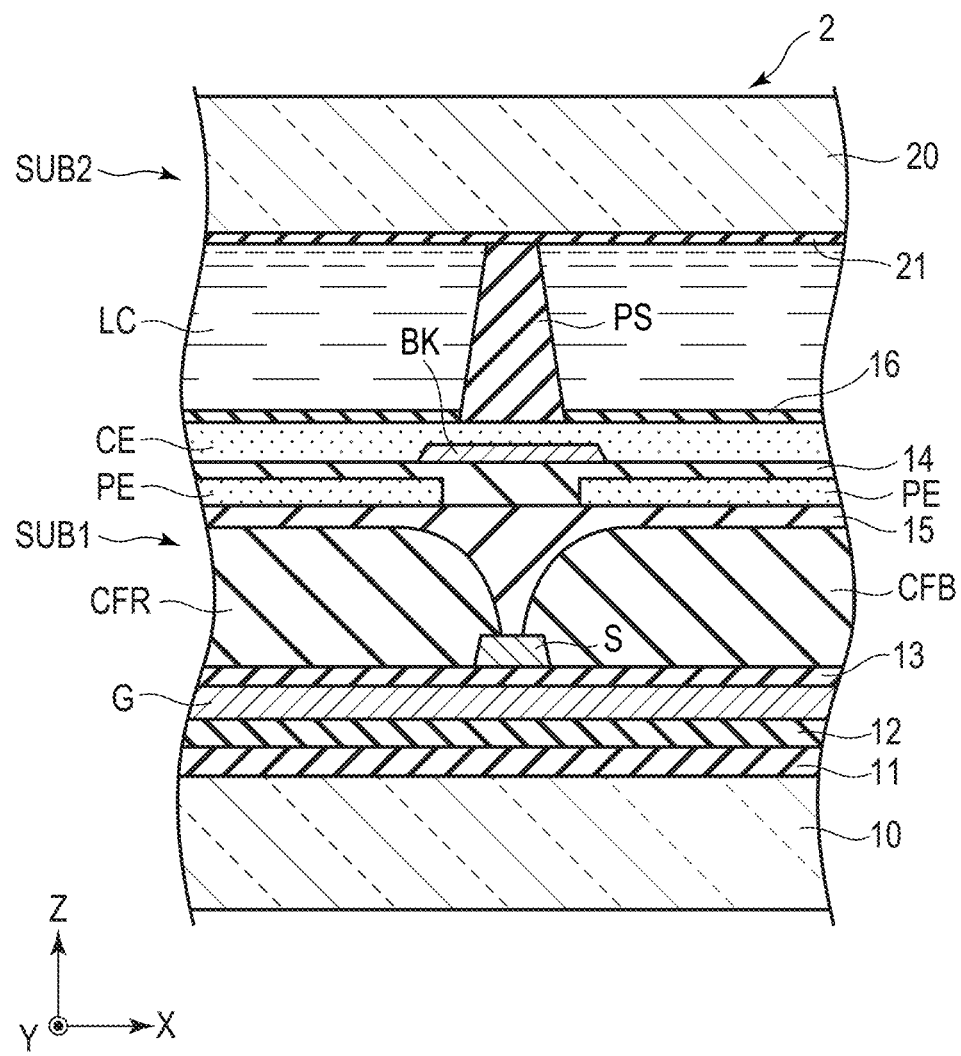
F I G. 14

DISPLAY DEVICE

CROSS-REFERENCE TO RELATED APPLICATIONS

This application is based upon and claims the benefit of priority from Japanese Patent Application No. 2021-208476, filed Dec. 22, 2021, the entire contents of which are incorporated herein by reference.

FIELD

Embodiments described herein relate generally to a display device.

BACKGROUND

In display devices such as liquid crystal display devices, metal layers such as scanning lines and signal lines are provided. As these metal layers could reflect external light, some measures should be taken.

For example, a technology of providing concave and convex portions on the surface of a protective panel provided in front of a liquid crystal panel is known. As another example, a technology of providing a black matrix overlapping a metal layer in plan view is known.

BRIEF DESCRIPTION OF THE DRAWINGS

FIG. 5 is a perspective view for explaining an example of a black film BK.

FIG. 14 is a schematic cross-sectional view of the display panel 2 including a spacer PS and the black film BK.

DETAILED DESCRIPTION

Figure 1:
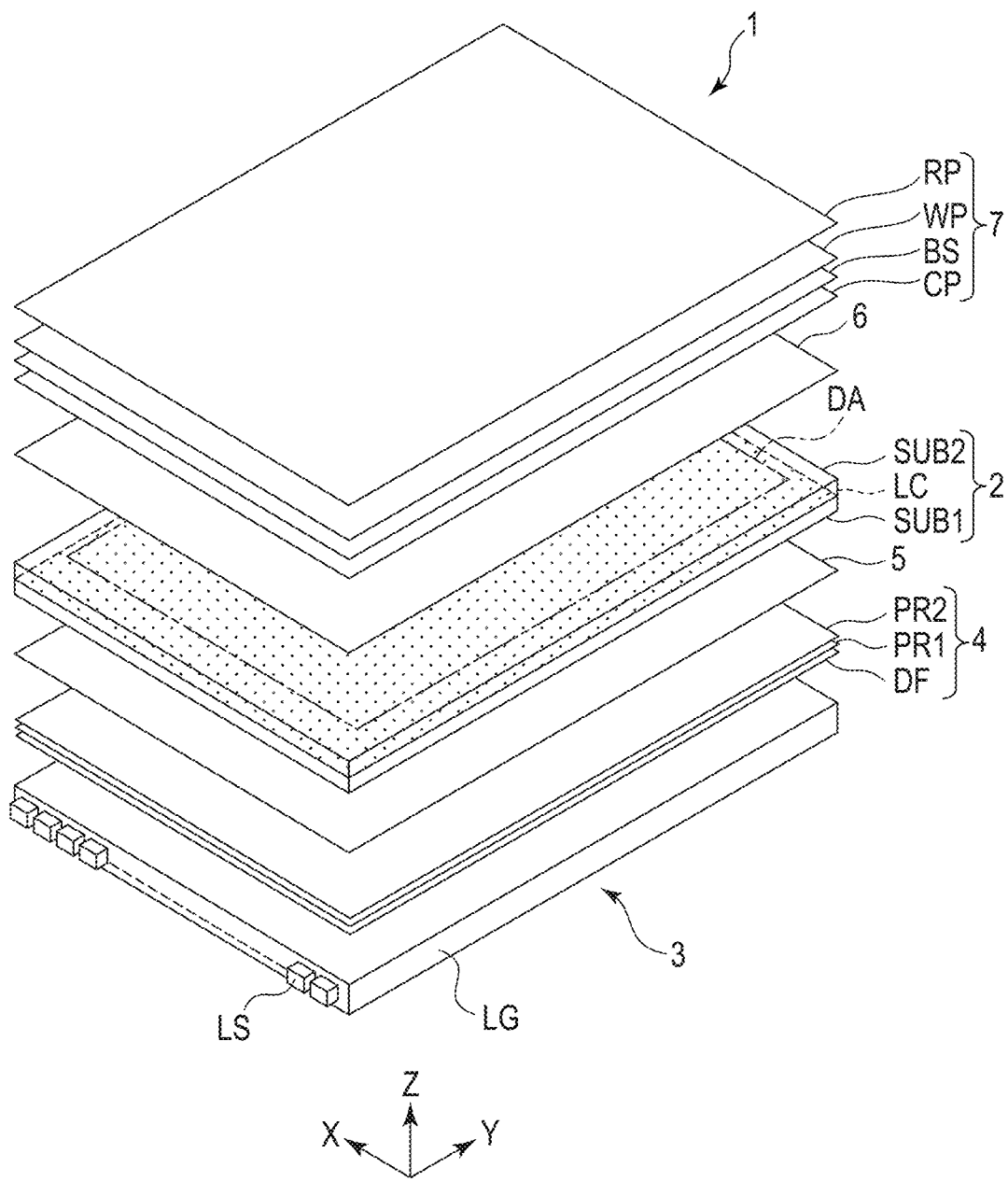
FIG. 1 is a schematic exploded perspective view of a display device 1 according to an embodiment.

In general, according to one embodiment, a display device comprises a first substrate, a second substrate facing the first substrate, and a liquid crystal layer held between the first substrate and the second substrate. The first substrate comprises an insulating substrate comprising a main surface, a switching element, a first pixel electrode electrically connected to the switching element, a second pixel electrode adjacent to the first pixel electrode, a wiring line provided between the first pixel electrode and the second pixel electrode, a convex portion provided between the wiring line and the liquid crystal layer, overlapping the wiring line and extending along the wiring line, and a black film formed into a belt-like shape overlapping the convex portion, and comprising an inclined surface which inclines with respect to the main surface.

According to another embodiment, a display device comprises a first substrate, a second substrate facing the first substrate, and a liquid crystal layer held between the first substrate and the second substrate. The first substrate comprises an insulating substrate comprising a main surface, a switching element, a first pixel electrode electrically connected to the switching element, a second pixel electrode adjacent to the first pixel electrode, a wiring line provided between the first pixel electrode and the second pixel electrode, a concave portion provided between the wiring line and the liquid crystal layer, overlapping the wiring line and extending along the wiring line, and a black film formed into a belt-like shape overlapping the concave portion, and comprising an inclined surface which inclines with respect to the main surface.

According to yet another embodiment, a display device comprises a display panel, an illumination device configured to illuminate the display panel, and an optical magnification system facing the display panel. The display panel comprises an insulating substrate comprising a main surface, a switching element, a first pixel electrode electrically connected to the switching element, a second pixel electrode adjacent to the first pixel electrode, and a black film provided between the first pixel electrode and the second pixel electrode in plan view, formed into a belt-like shape and comprising an inclined surface which inclines with respect to the main surface.

Various embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. It should be noted that the X-axis, the Y-axis and the Z-axis may intersect at an angle other than 90°. A direction parallel to the X-axis is referred to as an X-direction or a first direction X. A direction parallel to the Y-axis is referred to as a Y-direction or a second direction Y. A direction parallel to the Z-axis is referred to as a Z-direction or a third direction Z. The surface defined by the X-axis and the Y-axis is referred to as an X-Y plane. When the X-Y plane is viewed, the appearance is defined as a plan view.

In an embodiment, a liquid crystal display device comprising a liquid crystal display element is disclosed as an example of display devices. In this regard, the individual technical ideas disclosed in the embodiment can be also applied to a display device comprising another type of display element such as an organic electroluminescent display element, a micro LED or a mini LED.

The display device explained below can be used for various types of devices such as vehicle-mounted devices, smartphones, tablet terminals, mobile phone terminals, personal computers, television receivers, game consoles and head-mounted displays which display an image for virtual reality (VR).

FIG. 1 is a schematic exploded perspective view of a display device 1 according to an embodiment.

The display device 1 comprises a display panel 2 and an illumination device 3. The illumination device 3 is configured to illuminate the display panel 2. In the example of FIG. 1, the illumination device 3 is a side-edge type of illumination device comprising a light guide LG facing the display panel 2, and a plurality of light emitting elements LS facing a side surface of the light guide LG. It should be noted that the configuration of the illumination device 3 is not limited to the example of FIG. 1. For example, the illumination device 3 may be a direct type of illumination device in which a plurality of light emitting elements are provided so as to face the display panel 2.

In the example of FIG. 1, each of the display panel 2 and the light guide LG is formed into a rectangular shape comprising short sides parallel to the X-direction and long sides parallel to the Y-direction, and the display panel 2 and the light guide LG face each other in the Z-direction. However, the shape of the display panel 2 or the light guide LG is not limited to a rectangular shape and may be another shape.

The display panel 2 is a transmissive liquid crystal panel, and comprises a first substrate (array substrate) SUB1, a second substrate (counter-substrate) SUB2 facing the first substrate SUB1, and a liquid crystal layer LC held between the first substrate SUB1 and the second substrate SUB2. The first substrate SUB1 faces the illumination device 3 in the Z-direction. The display panel 2 comprises, for example, a display area DA having a rectangular shape.

Further, the display device 1 comprises an optical sheet group 4, a first polarizer 5 and a second polarizer 6. The optical sheet group 4 is provided between the light guide LG and the display panel 2. For example, the optical sheet group 4 includes a diffusion sheet DF which diffuses the light emitted from the light guide LG, and first and second prism sheets PR1 and PR2 in which a large number of prisms are formed. Part of the sheets included in the optical sheet group 4 may be omitted. Further, the optical sheet group 4 may include another sheet which is not shown in this example.

The first polarizer 5 is provided between the optical sheet group 4 and the first substrate SUB1. The second polarizer 6 is provided above the second substrate SUB2. In the present embodiment, for example, the polarization axis of the first polarizer 5 and the polarization axis of the second polarizer 6 are in a relationship of crossed-Nicol in which the axes are orthogonal to each other.

The display device 1 may comprise an optical magnification system 7 facing the display panel 2 depending on the use. The optical magnification system 7 faces the second substrate SUB2 in the Z-direction. The optical magnification system 7 comprises at least a beam splitter BS and a reflective polarizer RP. The beam splitter BS faces the reflective polarizer RP across an intervening gap in the Z-direction. The beam splitter BS may be either a polarization beam splitter which separates polarized light or a half mirror (semi-transmissive layer). For example, the reflective polarizer RP reflects first linearly polarized light and transmits second linearly polarized light orthogonal to the first linearly polarized light.

The optical magnification system 7 further comprises a circular polarizer CP and a wave plate WP. The circular polarizer CP is provided between the first polarizer 5 and the beam splitter BS and converts the linearly polarized light which passed through the first polarizer 5 into circularly polarized light. The wave plate WP is provided between the beam splitter BS and the reflective polarizer RP and imparts a quarter-wave phase difference to the light which passes through the wave plate WP.

This optical magnification system 7 can form an optical path such that light passes through the area between the beam splitter BS and the reflective polarizer RP three times. In other words, in the optical magnification system 7, the optical distance between the beam splitter BS and the reflective polarizer RP is approximately three times the actual interval between the beam splitter BS and the reflective polarizer RP. By this configuration, the display device 1 in which the thickness and the weight can be reduced can be provided. This display device 1 is suitable for, for example, a head-mounted display for VR.

Figure 2:
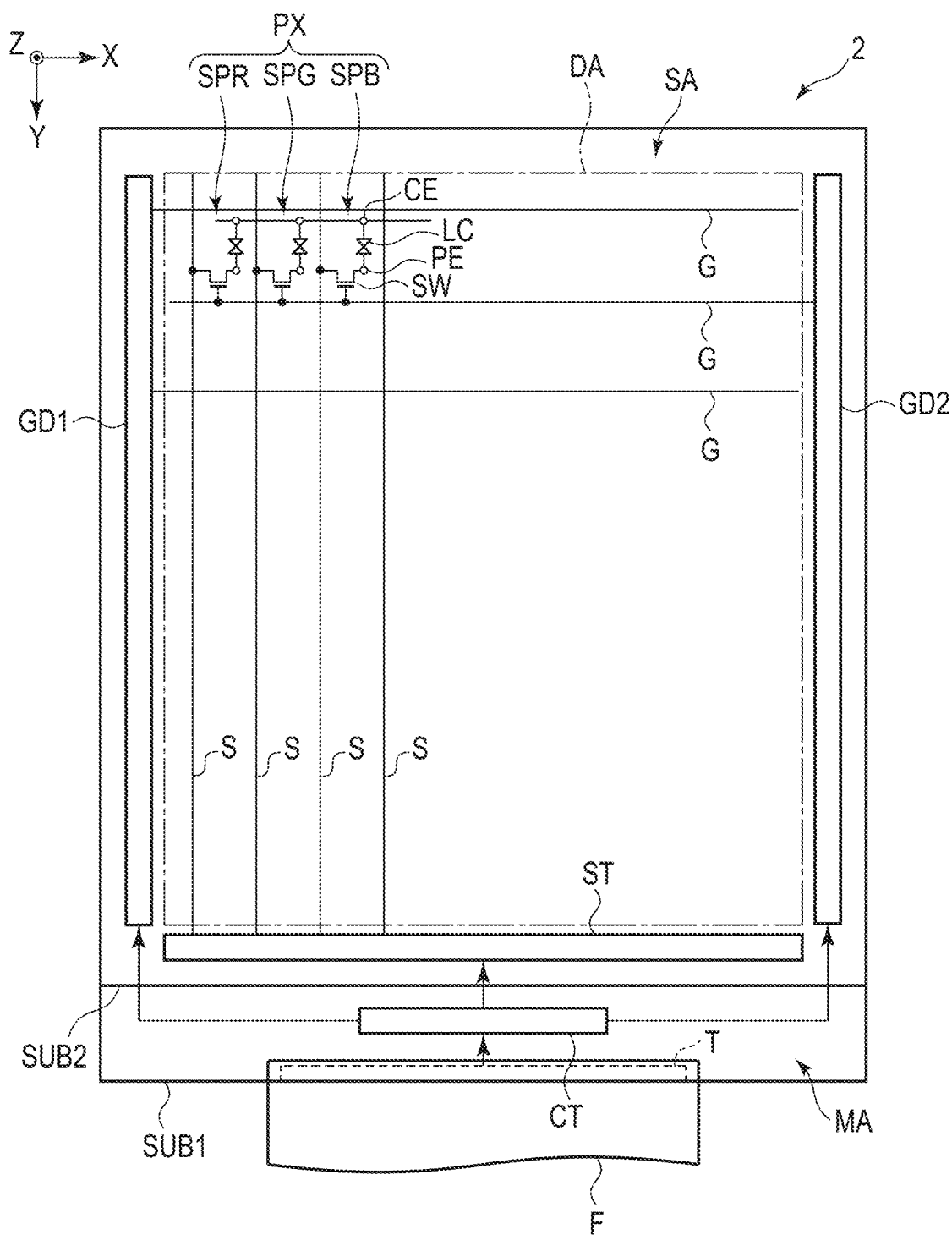
FIG. 2 is a schematic plan view of a display panel 2.

FIG. 2 is a schematic plan view of the display panel 2.

The display panel 2 comprises the display area DA and a surrounding area SA around the display area DA. In the example of FIG. 2, the lower side of the first substrate SUB1 protrudes from the second substrate SUB2 in the Y-direction. By this configuration, in the first substrate SUB1, a mounting area MA which does not overlap the second substrate SUB2 is formed. The mounting area MA is part of the surrounding area SA.

A plurality of pixels PX are provided in matrix in the display area DA. Each pixel PX comprises a plurality of subpixels. In the present embodiment, for example, each pixel PX comprises a red subpixel SPR, a green subpixel SPG and a blue subpixel SPB. It should be noted that each pixel PX may comprise a subpixel of another color such as white.

The display panel 2 comprises a plurality of scanning lines G, a plurality of signal lines (video lines) S, a first scanning driver GD1, a second scanning driver GD2 and a selector circuit ST. The scanning lines G extend in the X-direction and are arranged in the Y-direction. The signal lines S extend in the Y-direction and are arranged in the X-direction. Each scanning line G is connected to at least one of the first scanning driver GD1 and the second scanning driver GD2. Each signal line S is connected to the selector circuit ST.

In the example of FIG. 2, a controller CT is mounted in the mounting area MA. A terminal portion T is provided in the mounting area MA. A flexible printed circuit F is connected to the terminal portion T. It should be noted that the controller CT may be mounted on the flexible printed circuit F. The controller CT may consist of an IC and various types of circuit elements.

The flexible printed circuit F inputs various types of signals transmitted from the board of the electronic device on which the display device 1 is mounted, etc., to the controller CT. Based on the input signal, the controller CT supplies a video signal to the selector circuit ST and controls the first scanning driver GD1, the second scanning driver GD2 and the selector circuit ST. The first scanning driver GD1 and the second scanning driver GD2 supply a scanning signal to the scanning lines G in series. The selector circuit ST supplies the input video signal to the signal lines S in series.

Each pixel PX comprises a pixel electrode PE, a switching element (thin-film transistor) SW and a common electrode CE to which common voltage is applied. The switching element SW is connected to the pixel electrode PE, the scanning line G and the signal line S. When a scanning signal is supplied to the scanning line G, the switching element SW supplies the video signal of the signal line S to the pixel electrode PE. The common electrode CE is formed over a plurality of subpixels. When a video signal is supplied to the pixel electrode PE, a potential difference is formed between the pixel electrode PE and the common electrode CE. An electric field generated by the potential difference affects the liquid crystal layer LC.

In the present embodiment, all of the scanning lines G, the signal lines S, the first scanning driver GD1, the second scanning driver GD2, the selector circuit ST, the switching elements SW, the pixel electrodes PE and the common electrode CE are provided in the first substrate SUB1. It should be noted that the common electrode CE may be provided in the second substrate SUB2.

Figure 3:
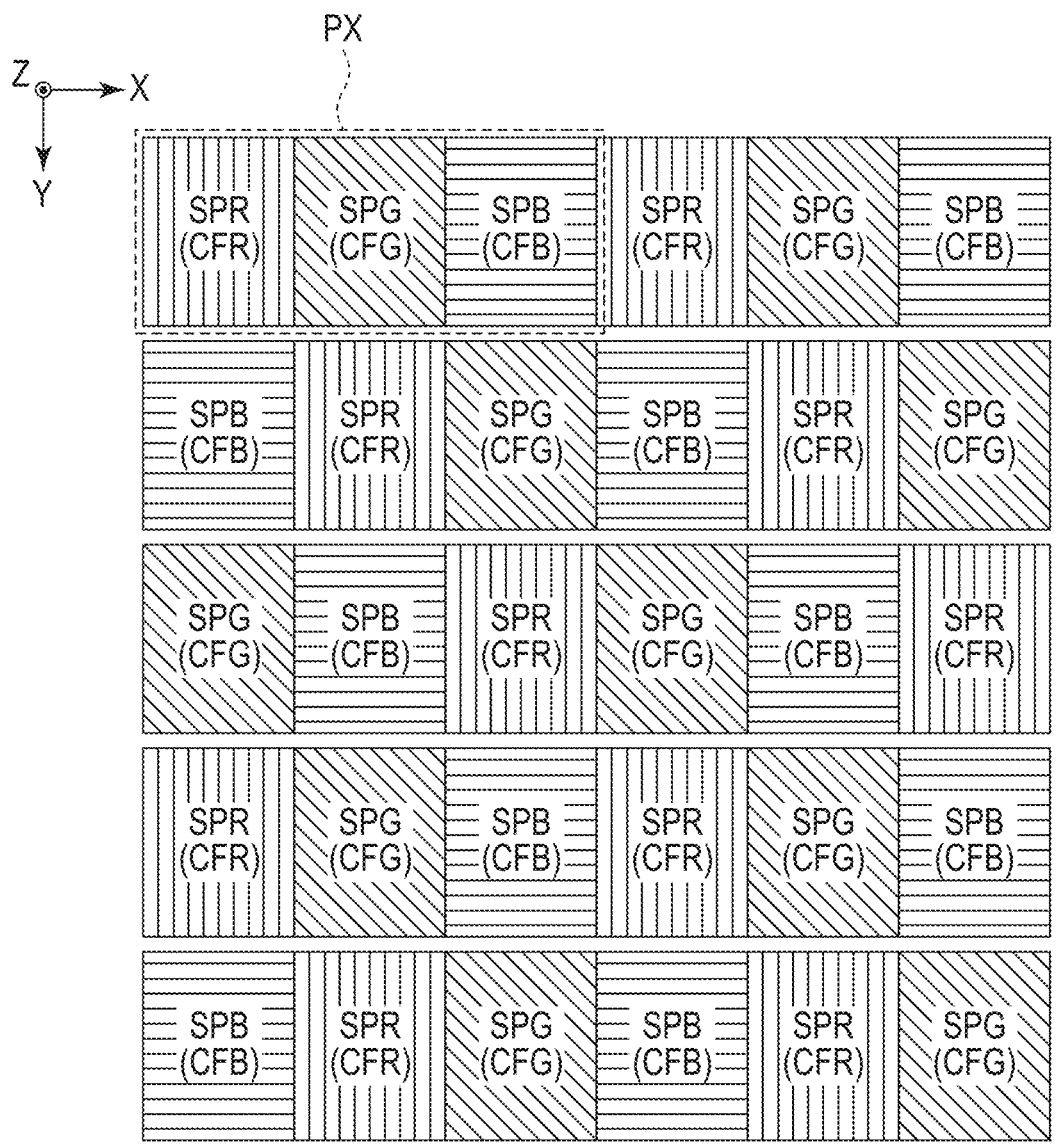
FIG. 3 is a schematic plan view showing an example of the layout of subpixels SPR, SPG and SPB.

FIG. 3 is a schematic plan view showing an example of the layout of subpixels SPR, SPG and SPB.

A red color filter CFR is provided in each subpixel SPR. A green color filter CFG is provided in each subpixel SPG. A blue color filter CFB is provided in each subpixel SPB. In the present embodiment, for example, all of color filters CFR, CFG and CFB are provided in the first substrate SUB1. It should be noted that color filters CFR, CFG and CFB may be provided in the second substrate SUB2.

In the example of FIG. 3, subpixels SPR, SPG and SPB are arranged in the X-direction in this order. Subpixels SPR, SPB and SPG are arranged in the Y-direction in this order. By this configuration, subpixels SPR having the same color are arranged in an oblique direction intersecting with the X-direction and the Y-direction. In the same manner, subpixels SPG are arranged in an oblique direction, and subpixels SPB are arranged in an oblique direction. Color filters CFR, CFG and CFB are provided in a dot-shape (island-like shape) with respect to subpixels SPR, SPG and SPB.

It should be noted that the layout of subpixels SPR, SPG and SPB is not limited to the example shown in FIG. 3. For example, a red pixel column in which subpixels SPR are arranged in the Y-direction, a green pixel column in which subpixels SPG are arranged in the Y-direction and a blue pixel column in which subpixels SPB are arranged in the Y-direction may be arranged in the X-direction in order.

Figure 4:
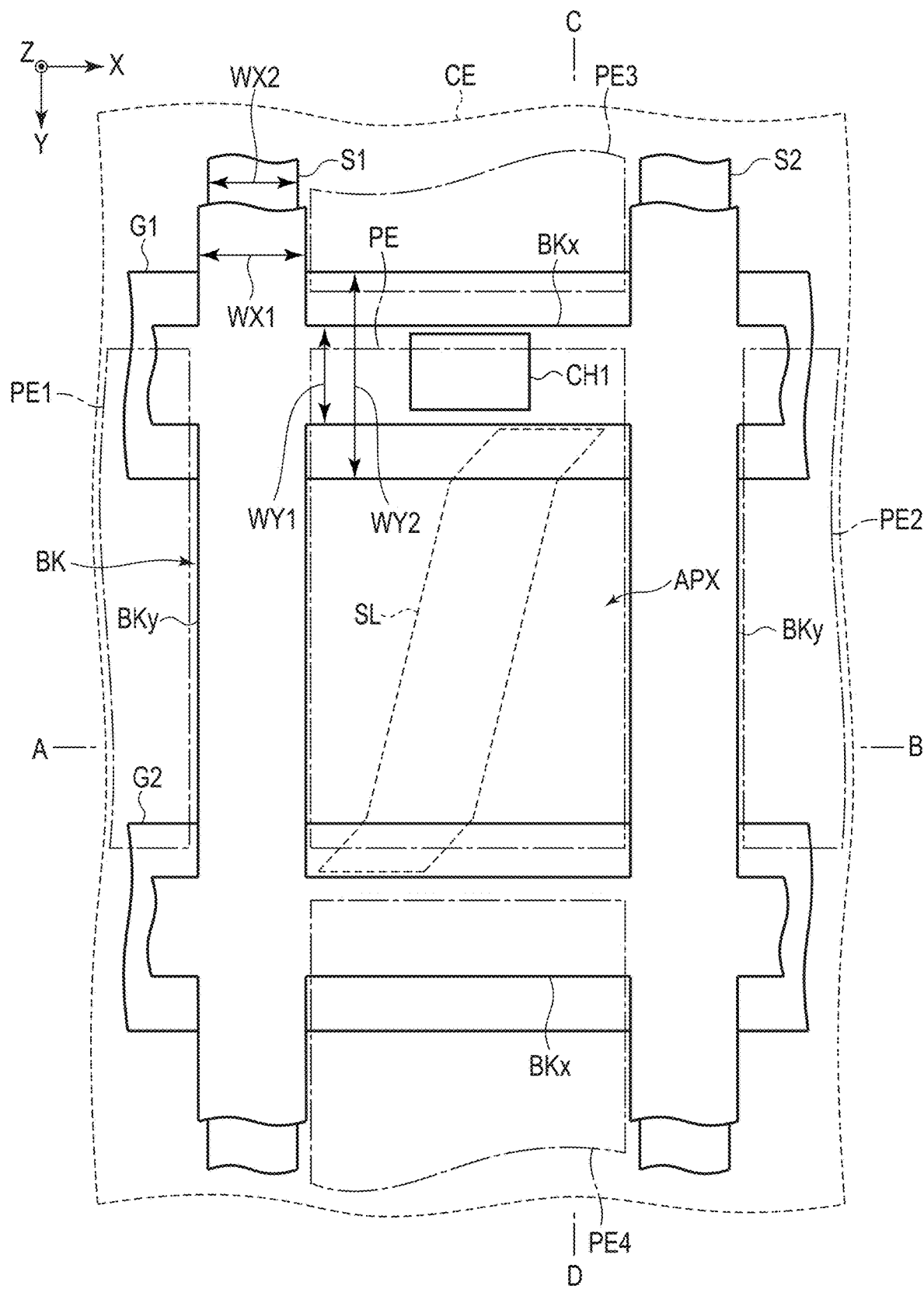
FIG. 4 is a schematic plan view showing part of elements of subpixels.

FIG. 4 is a schematic plan view showing part of elements of subpixels.

Here, this specification focuses attention on the subpixel defined by two scanning lines G1 and G2 extending in the X-direction and two signal lines S1 and S2 extending in the Y-direction.

As shown by one-dot chain lines, the pixel electrode PE is located between the signal lines S1 and S2 in the X-direction and is located between the scanning lines G1 and G2 in the Y-direction. The pixel electrode PE is located between the pixel electrodes PE1 and PE2 in the X-direction and is located between the pixel electrode PE3 and PE4 in the Y-direction.

As shown by dotted lines, the common electrode CE overlaps the scanning lines G1 and G2, the signal lines S1 and S2 and the pixel electrodes PE, PE1, PE2, PE3 and PE4. The common electrode CE comprises a single slit SL overlapping the pixel electrode PE. The slit SL extends in, for example, an oblique direction intersecting with the X-direction and the Y-direction. It should be noted that the common electrode CE may comprise a plurality of slits SL overlapping a single pixel electrode PE.

A black film BK is a film whose color could be viewed as black, and may be either an insulator such as a dielectric multilayer film or a conductor such as a light-shielding metal film. The black film BK is formed into a grating shape comprising a plurality of first portions BKx extending in the X-direction and a plurality of second portions BKy extending in the Y-direction. In the example shown in FIG. 4, the black film BK surrounds the pixel electrode PE.

Each first portion BKx extends in the X-direction and is formed into a belt-like shape having width WY1 in the Y-direction. The first portions BKx overlap the scanning lines G1 and G2, respectively. When the pixel electrodes PE and PE3 shown in the figure are defined as first and second pixel electrodes which are adjacent to each other in the Y-direction, respectively, the first portion BKx and the scanning line G1 are provided between the first pixel electrode PE and the second pixel electrode PE3.

In the example shown in the figure, width WY1 of the first portion BKx is less than width WY2 of the scanning line G1 in the Y-direction. It should be noted that width WY1 of the first portion BKx may be greater than or equal to width WY2 of the scanning line G1. In this case, the first portion BKx may overlap the scanning line G1 so as to cover the entire part of the scanning line G1.

Each second portion BKy extends in the Y-direction and is formed into a belt-like shape having width WX1 in the X-direction. The second portions BKy overlap the signal lines S1 and S2, respectively. When the pixel electrodes PE and PE1 shown in the figure are defined as first and second pixel electrodes which are adjacent to each other in the X-direction, respectively, the second portion BKy and the signal line S1 are provided between the first pixel electrode PE and the second pixel electrode PE1.

In the example shown in the figure, width WX1 of the second portion BKy is greater than width WX2 of the signal line S1 in the X-direction. The second portion BKy overlaps the signal line S1 so as to cover the entire part of the signal line S1. It should be noted that width WX1 of the second portion BKy may be less than or equal to width WX2 of the signal line S1.

In this manner, in the present embodiment, as seen in plan view, the black film BK is provided so as to overlap both the boundary of subpixels which are adjacent to each other in the X-direction (or the area between pixel electrodes which are adjacent to each other in the X-direction) and the boundary of subpixels which are adjacent to each other in the Y-direction (or the area between pixel electrodes which are adjacent to each other in the Y-direction). It should be noted that the black film BK may be provided in either the first substrate SUB1 or the second substrate SUB2.

An aperture APX surrounded by two first portions BKx which are adjacent to each other in the Y-direction and two second portions BKy which are adjacent to each other in the X-direction is formed for each subpixel. The pixel electrode PE overlaps a large part of the aperture APX.

At a position overlapping the first portion BKx, a contact hole CH1 for connecting the switching element SW and the pixel electrode PE is formed.

FIG. 5 is a perspective view for explaining an example of the black film BK. Here, this specification explains a case where the black film BK is provided in the first substrate SUB1.

An insulating substrate 10 comprises a main surface 10A. The main surface 10A is a surface parallel to the X-Y plane. The scanning lines G1 and G2 are located between the insulating substrate 10 and the first portions BKx of the black film BK. The signal lines S1 and S2 are located between the insulating substrate 10 and the second portions BKy of the black film BK.

A convex portion CV is formed into a grating shape comprising a plurality of first convex portions CVx extending in the X-direction and a plurality of second convex portions CVy extending in the Y-direction. The first convex portions CVx extend in the X-direction and overlap the scanning lines G1 and G2. The second convex portions CVy extend in the Y-direction and overlap the signal lines S1 and S2. In the example shown in FIG. 5, the convex portion CV surrounds the pixel electrode PE.

This convex portion CV is, for example, an insulator, and may be formed of either an inorganic material or an organic material. It should be noted that the convex portion CV may be a conductor such as metal or conductive resin.

The black film BK overlaps the convex portion CV and covers the convex portion CV. In other words, the first portions BKx overlap the first convex portions CVx, and the second portions BKy overlap the second convex portions CVy. The black film BK is formed into a grating shape similar to that of the convex portion CV and surrounds the pixel electrode PE. An inclined surface BKS which inclines with respect to the main surface 10A (or the X-Y plane) is formed on the top of the black film BK. For example, this black film BK absorbs the reflected light (external light) from the optical magnification system 7 shown in FIG. 1 and prevents undesired reflection on the scanning lines G1 and G2 and the signal line S1 and S2. The inclined surface BKS could be a reflective surface which reflects external light which is not absorbed by the black film BK. As described later, the angle of inclination of the inclined surface BKS is set so as to trap external light in the display panel 2. This configuration prevents undesired reflected light proceeding to the optical magnification system 7 and prevents the degradation of the display quality of a display image.

Figure 6:
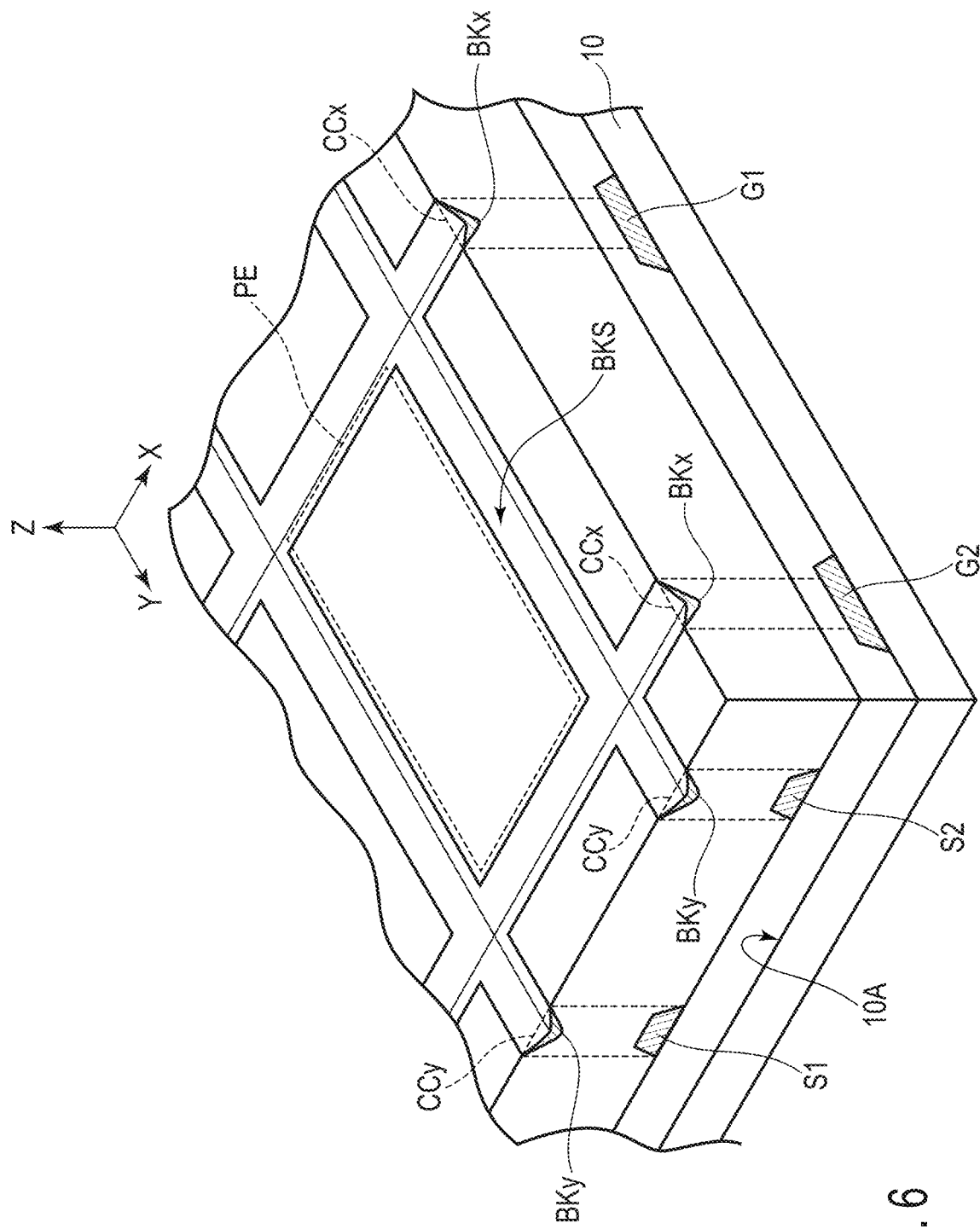
FIG. 6 is a perspective view for explaining another example of the black film BK.

FIG. 6 is a perspective view for explaining another example of the black film BK. Here, this specification explains a case where the black film BK is provided in the first substrate SUB1.

A concave portion CC is formed into a grating shape comprising a plurality of first concave portions CCx extending in the X-direction and a plurality of second concave portions CCy extending in the Y-direction. The first concave portions CCx extend in the X-direction and overlap the scanning lines G1 and G2. The second concave portions CCy extend in the Y-direction and overlap the signal lines S1 and S2. In the example shown in FIG. 6, the concave portion CC surrounds the pixel electrode PE.

This concave portion CC is formed in, for example, an insulating film. However, the concave portion CC may be formed in a conductive film.

The black film BK overlaps the concave portion CC and covers the concave portion CC. In other words, the first portions BKx overlap the first concave portions CCx, and the second portions BKy overlap the second concave portions CCy. The black film BK surrounds the pixel electrode PE. The inclined surface BKS which inclines with respect to the main surface 10A (or the X-Y plane) is formed on the top of the black film BK. In this example, effects similar to those of the example shown in FIG. 5 are obtained.

Figure 7:
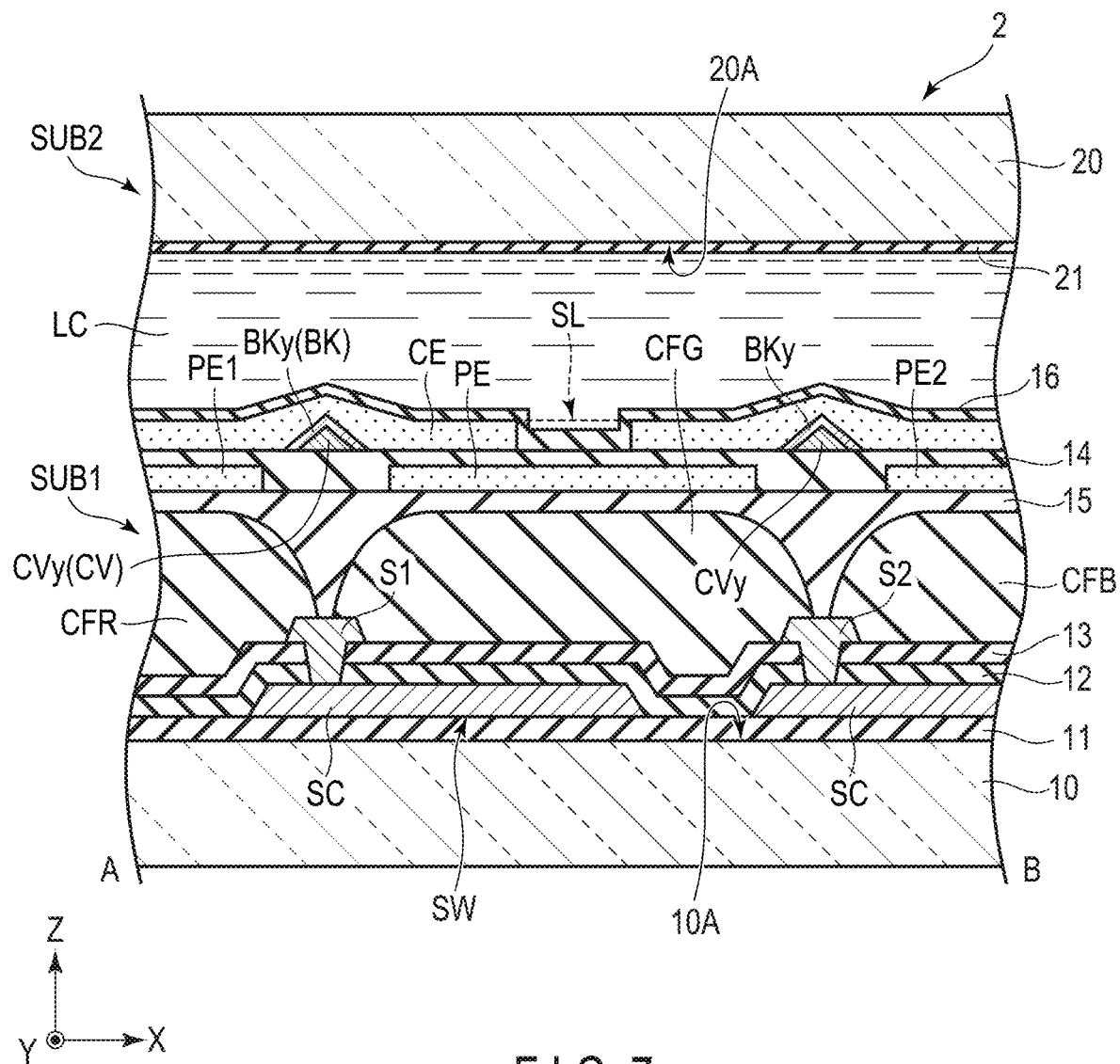
FIG. 7 is a schematic cross-sectional view of the display panel 2 including the subpixels shown in FIG. 4.

FIG. 7 is a schematic cross-sectional view of the display panel 2 including the subpixels shown in FIG. 4. FIG. 7 shows the section of the display panel 2 along the A-B line of FIG. 4. Here, this specification explains a case where the black film BK overlaps the convex portion CV.

The first substrate SUB1 comprises the signal lines S1 and S2, the switching element SW comprising a semiconductor layer SC, the pixel electrode PE, the common electrode CE, the convex portion CV, the black film BK, and color filters CFR, CFG and CFB as described above. Further, the first substrate SUB1 comprises the insulating substrate 10, insulating films 11 to 15 and an alignment film 16.

The insulating substrate 10 is formed of, for example, glass. However, the insulating substrate 10 may be formed of a resinous material such as polyimide. The main surface 10A of the insulating substrate 10 is located on a side facing the second substrate SUB2. The insulating films 11 to 14 are inorganic insulating films and are formed of an inorganic material such as silicon nitride or silicon oxide. The insulating film 15 is an organic insulating film and is formed of an organic material such as acrylic resin. The pixel electrode PE and the common electrode CE are transparent electrodes and are formed of a transparent conductive material such as indium tin oxide (ITO) or indium zinc oxide (IZO). The scanning lines G1 and G2 and the signal lines S1 and S2 are metal lines and are formed of, for example, a metal material such as molybdenum, aluminum, titanium or tungsten, or a stacked layer body or alloy of these materials.

The insulating film 11 is provided on the main surface 10A of the insulating substrate 10. The semiconductor layer SC is provided on the insulating film 11. The insulating film 12 covers the semiconductor layer SC and the insulating film 11. The insulating film 13 covers the insulating film 12. The scanning lines and the gate electrode (shown in FIG. 8) of the switching element SW are provided at least between the insulating substrate 10 and the insulating film 11 or between the insulating film 12 and the insulating film 13. The signal lines S1 and S2 are provided on the insulating film 13. The signal lines S1 and S2 are in contact with the semiconductor layer SC through the respective contact holes penetrating the insulating film 12 and the insulating film 13.

The color filters CFR, CFG and CFB are provided on the signal lines S1 and S2 and the insulating film 13. The insulating film 15 covers the color filters CFR, CFG and CFB. The color filters CFR, CFG and CFB and the insulating film 15 are formed so as to be thicker than the other insulating films 11 to 14. The insulating film 15 flattens the irregularity caused by the switching element SW and the color filters CFR, CFG and CFB.

The pixel electrode PE is provided on the insulating film 15. The pixel electrode PE is electrically connected to the semiconductor layer SC through the contact hole (contact hole CH1 shown in FIG. 4) penetrating the insulating film 15. It should be noted that another conductive layer may be interposed between the pixel electrode PE and the semiconductor layer SC.

The pixel electrode PE of each subpixel faces the color filter CFR, CFG or CFB. For example, the color filter CFG is equivalent to a first color filter and is provided between the insulating substrate 10 and the pixel electrode PE. The color filter CFR is equivalent to a second color filter and is provided between the insulating substrate 10 and the pixel electrode PE1. The color filter CFB is equivalent to a third color filter and is provided between the insulating substrate 10 and the pixel electrode PE2.

The insulating film 14 covers the pixel electrode PE and the insulating film 15. The common electrode CE is provided on the insulating film 14. The common electrode CE faces the pixel electrode PE via the insulating film 14. The slit SL of the common electrode CE overlaps the pixel electrode PE. The common electrode CE is covered with the alignment film 16.

The second convex portions CVy of the convex portion CV are provided between the respective signal lines S1 and S2 and the liquid crystal layer LC. In the example shown in FIG. 7, the second convex portions CVy are provided on the insulating film 14 and overlap the signal lines S1 and S2, respectively.

When this convex portion CV is an insulator, the convex portion CV may be integrally formed with the insulating film 14 or may be formed as a separate body from the insulating film 14. The convex portion CV may not be provided between the insulating film 14 and the common electrode CE and may be provided between the insulating film 15 and the insulating film 14.

The second portions BKy of the black film BK overlap the second convex portions CVy. The second portions BKy are located between the second convex portions CVy and the common electrode CE and are in contact with both of them. When the black film BK is a conductive film, the black film BK is electrically connected to the common electrode CE and has the same potential as the common electrode CE.

The reflectance of the black film BK is less than that of the signal lines S1 and S2. For this reason, even if undesired reflection occurs on the surface of the black film BK, the brightness of the reflected light can be reduced compared to a case where undesired reflection occurs on the surfaces of the signal lines S1 and S2.

The second portions Bky of the black film BK overlap the boundary between the color filter CFR and the color filter CFG and the boundary between the color filter CFG and the color filter CFB.

The second substrate SUB2 comprises an insulating substrate 20 and an alignment film 21. The insulating substrate 20 is formed of the same material as the insulating substrate 10. The insulating substrate 20 comprises a main surface 20A on a side facing the first substrate SUB1. The main surface 20A is a surface parallel to the X-Y plane. The alignment film 21 covers the main surface 20A.

These first substrate SUB1 and second substrate SUB2 are attached to each other by an annular sealant in the surrounding area SA shown in FIG. 2. The liquid crystal layer LC is sealed in between the first substrate SUB1 and the second substrate SUB2.

When a video signal is supplied to pixel electrode PE, an electric field is formed between pixel electrode PE and the common electrode CE. As this electric field affects the liquid crystal layer LC through the slit SL, the alignment of the liquid crystal molecules contained in the liquid crystal layer LC is controlled.

Figure 8:
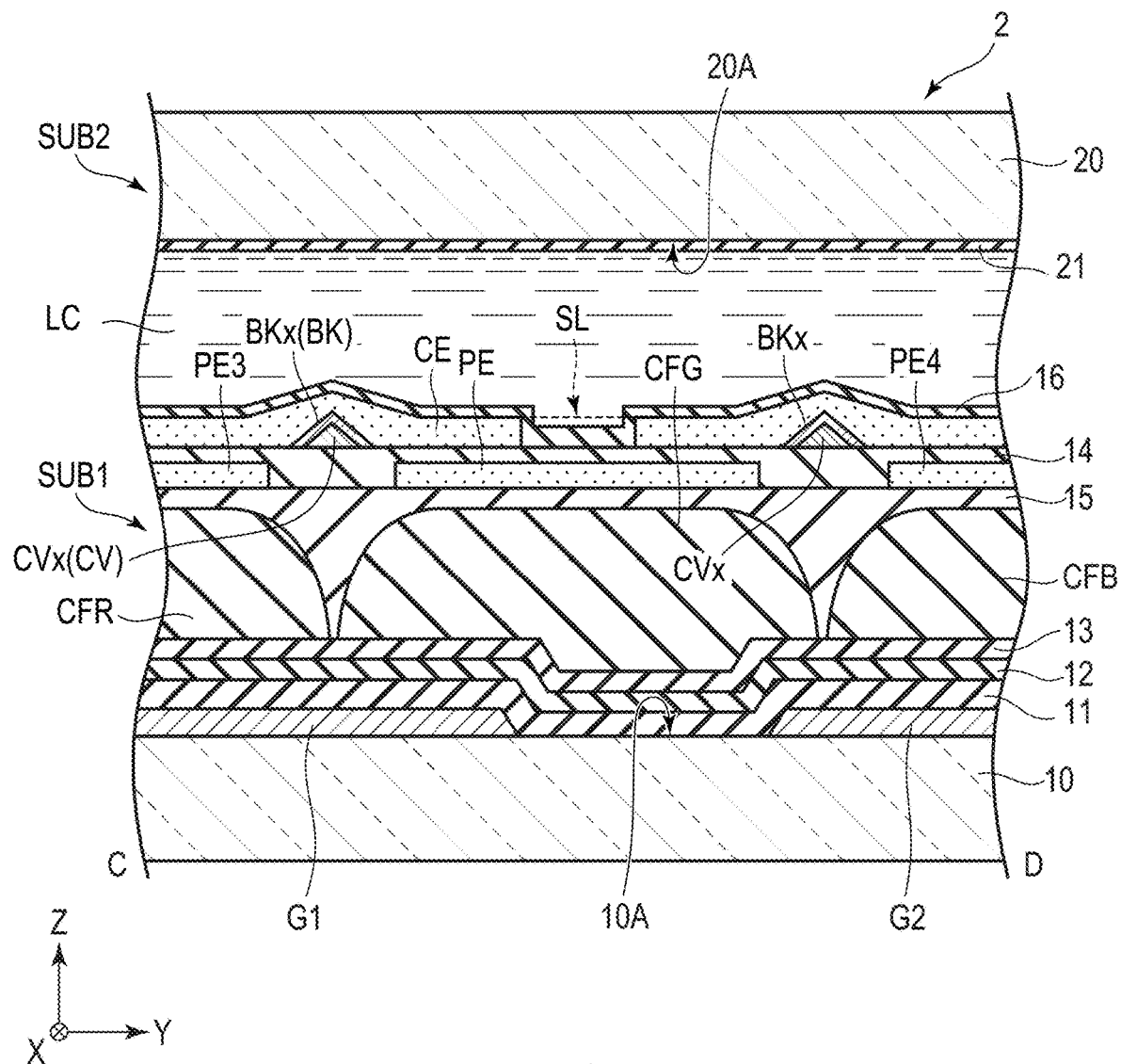
FIG. 8 is a schematic cross-sectional view of the display panel 2 including the subpixels shown in FIG. 4.

FIG. 8 is a schematic cross-sectional view of the display panel 2 including the subpixels shown in FIG. 4. FIG. 8 shows the section of the display panel 2 along the C-D line of FIG. 4. Here, this specification explains a case where the black film BK overlaps the convex portion CV.

The first substrate SUB1 comprises the scanning lines G1 and G2. In the example shown in FIG. 8, the scanning lines G1 and G2 are provided between the insulating substrate 10 and the insulating film 11.

The first convex portions CVx of the convex portion CV are provided between the respective scanning lines G1 and G2 and the liquid crystal layer LC. In the example shown in FIG. 8, the first convex portions CVx are provided on the insulating film 14 and overlap the scanning lines G1 and G2, respectively. The first convex portions CVx are integrally formed with the second convex portions CVy shown in FIG. 7.

The first portions BKx of the black film BK overlap the first convex portions CVx. The first portions BKx are located between the first convex portions CVx and the common electrode CE and are in contact with both of them. When the first portions BKx are a conductive film, the first portions BKx are electrically connected to the common electrode CE.

The reflectance of the black film BK is less than that of the scanning lines G1 and G2. For this reason, even if undesired reflection occurs on the surface of the black film BK, the brightness of the reflected light can be reduced compared to a case where undesired reflection occurs on the surfaces of the scanning lines G1 and G2.

The first portions BKx of the black film BK overlap the boundary between the color filter CFR and the color filter CFG and the boundary between the color filter CFG and the color filter CFB.

Figure 9:
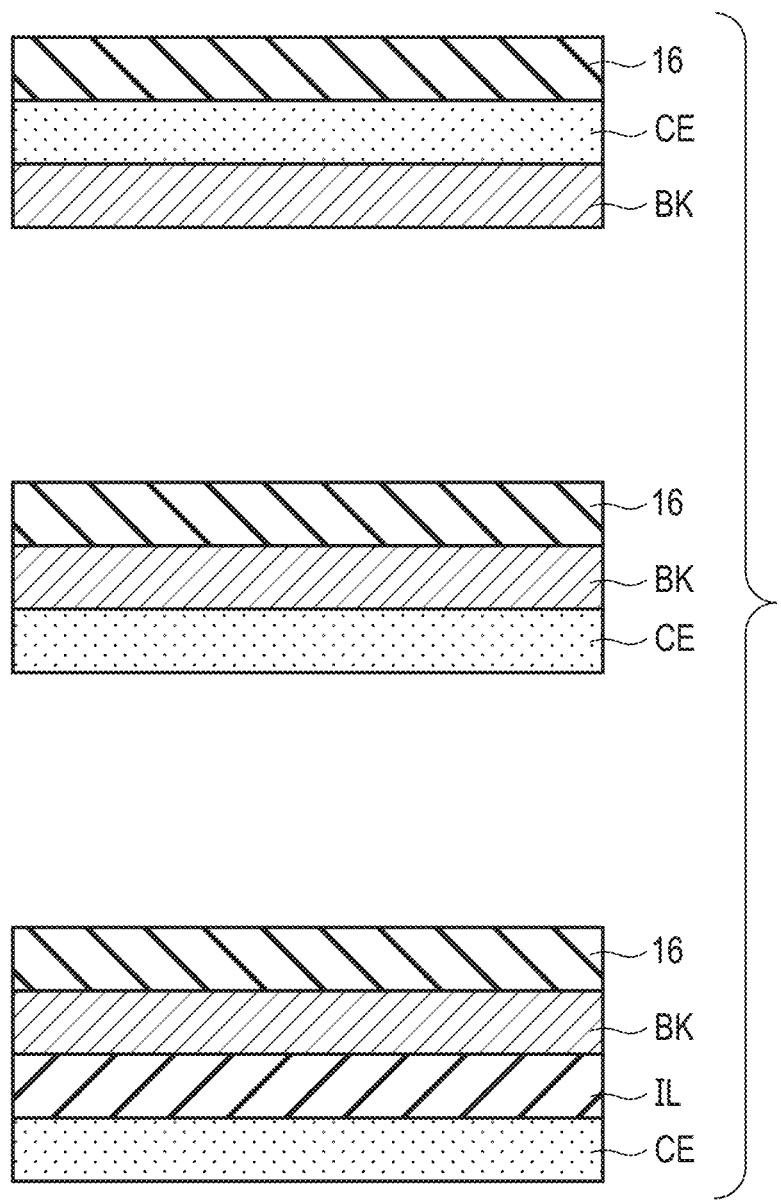
FIG. 9 is a cross-sectional view for explaining an example of the locational relationship between a common electrode CE and the black film BK.

FIG. 9 is a cross-sectional view for explaining an example of the locational relationship between the common electrode CE and the black film BK. FIG. 9 shows that the black film BK comprises a flat surface. However, the surface comprises a concave or convex inclined surface as described above.

In the example shown in the upper part of FIG. 9, the common electrode CE is provided on the black film BK. In other words, the common electrode CE is located between the black film BK and the alignment film 16 and is in contact with the black film BK.

In the example shown in the middle part of FIG. 9, the common electrode CE is provided under the black film BK. In other words, the black film BK is located between the common electrode CE and the alignment film 16 and is in contact with the common electrode CE.

In the example shown in the lower part of FIG. 9, an insulating film IL is interposed between the common electrode CE and the black film BK. For example, the black film BK is located between the common electrode CE and the alignment film 16. However, the common electrode CE may be located between the black film BK and the alignment film 16. When the black film BK is a conductive film, the black film BK may be in contact with the common electrode CE via a through hole which penetrates the insulating film IL.

Figure 10:
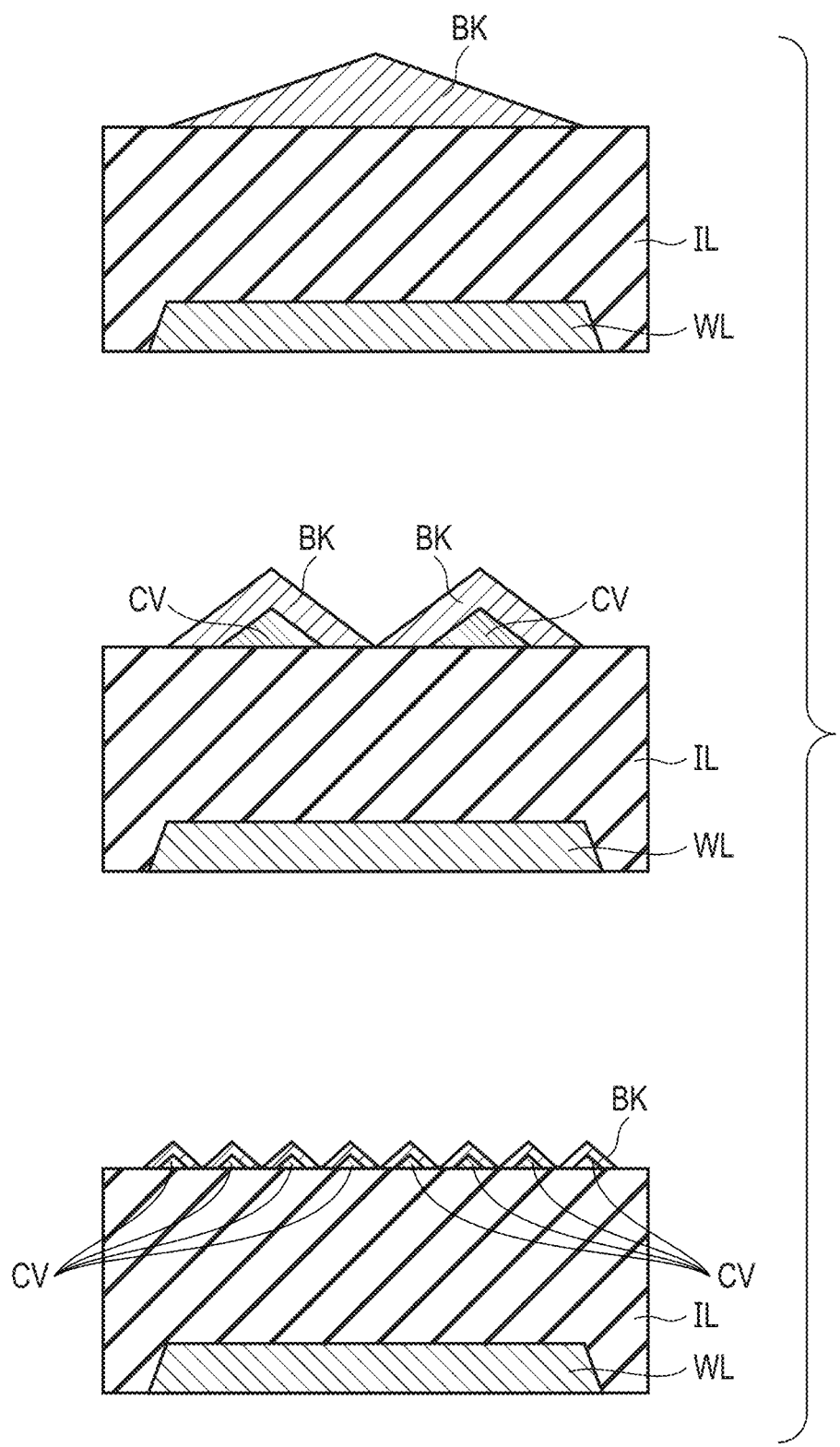
FIG. 10 is a cross-sectional view for explaining an example of the cross-sectional shape of the black film BK.

FIG. 10 is a cross-sectional view for explaining an example of the cross-sectional shape of the black film BK. In FIG. 10, the configuration between the black film BK and a wiring line WL is omitted. The wiring line WL is, for example, the signal line or scanning line described above. The surface of the black film BK of each example shown in FIG. 10 is formed into a convex shape protruding from the insulating film IL.

In the example shown in the upper part of FIG. 10, the black film BK is provided on the insulating film IL immediately above the wiring line WL and is formed so as to have a triangular section. In other words, the convex portion CV shown in FIG. 5 is omitted. The section of the black film BK is formed such that the thickness is decreased from the central portion to the peripheral portion.

In the example shown in the middle part of FIG. 10, the black film BK is formed so as to overlap two convex portions CV immediately above the wiring line WL.

In the example shown in the lower part of FIG. 10, the black film BK is formed so as to overlap a plurality of tiny convex portions CV immediately above the wiring line WL.

Figure 11:
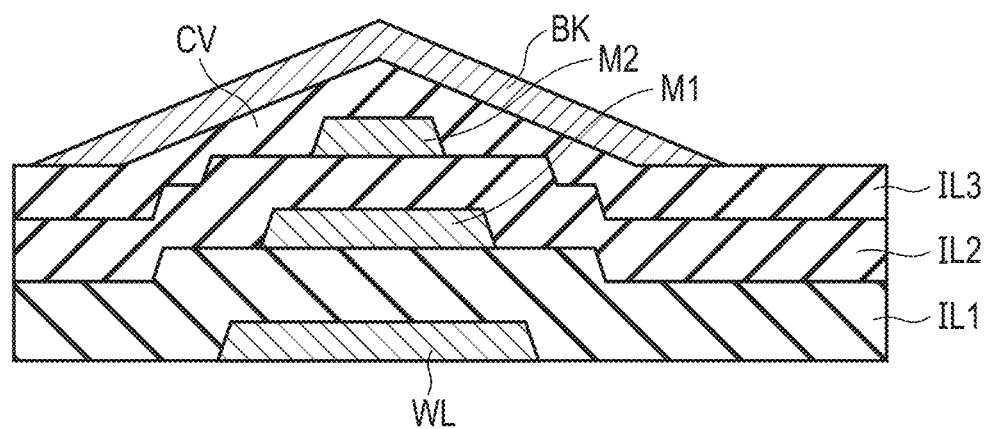
FIG. 11 is a cross-sectional view for explaining another example of the cross-sectional shape of the black film BK.

FIG. 11 is a cross-sectional view for explaining another example of the cross-sectional shape of the black film BK.

A plurality of insulating films IL1, IL2 and IL3 and conductive layers M1 and M2 are interposed between the wiring line WL and the black film BK. The insulating film IL3 forms the convex portion CV immediately above the wiring line WL by the effect of the step by the wiring line WL and the conductive layers M1 and M2. The black film BK overlaps the convex portion CV of the insulating film 13 so as to cover the convex portion CV. By this configuration, the black film BK having a convex surface is formed.

The examples of the cross-sectional shape of the black film BK in FIG. 10 and FIG. 11 can be combined with the examples of the locational relationship between the common electrode CE and the black film BK in FIG. 9, and can be further replaced by the cross-sectional shape of the black film BK shown in FIG. 5.

Figure 12:
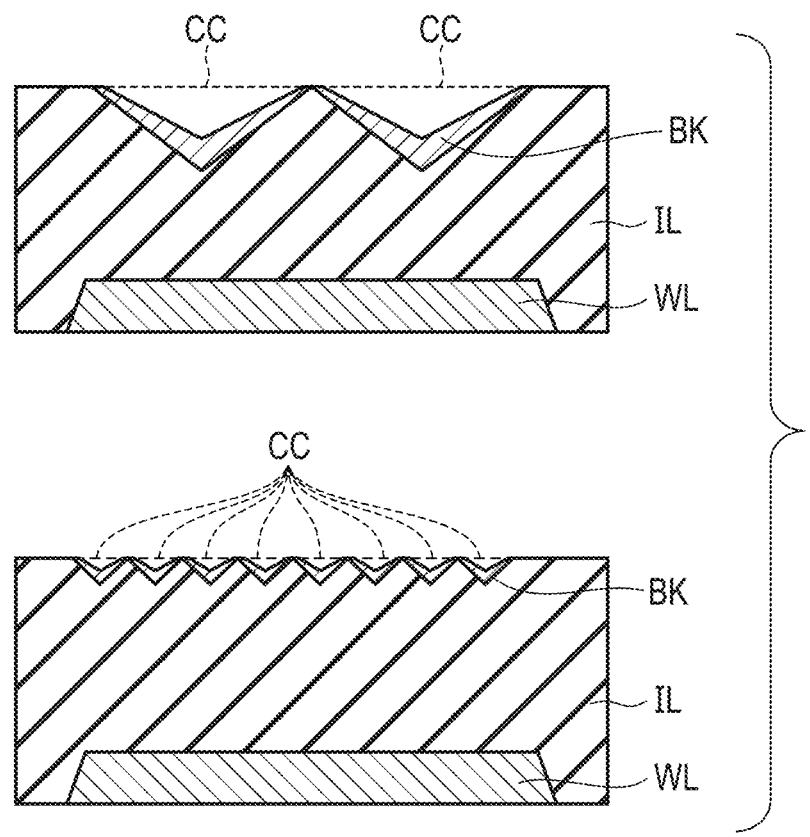
FIG. 12 is a cross-sectional view for explaining another example of the cross-sectional shape of the black film BK.

FIG. 12 is a cross-sectional view for explaining another example of the cross-sectional shape of the black film BK. In FIG. 12, the configuration between the black film BK and the wiring line WL is omitted. The wiring line WL is, for example, the signal line or the scanning line described above. The surface of the black film BK of each example shown in FIG. 12 is formed into a concave shape.

In the example shown in the upper part of FIG. 12, the black film BK is formed so as to overlap two concave portions CC formed in the insulating film IL immediately above the wiring line WL.

In the example shown in the lower part of FIG. 12, the black film BK is formed so as to overlap a plurality of tiny concave portions CC immediately above the wiring line WL.

The examples of the cross-sectional shape of the black film BK in FIG. 12 can be combined with the examples of the locational relationship between the common electrode CE and the black film BK in FIG. 9, and can be further replaced by the cross-sectional shape of the black film BK shown in FIG. 6.

Figure 13:
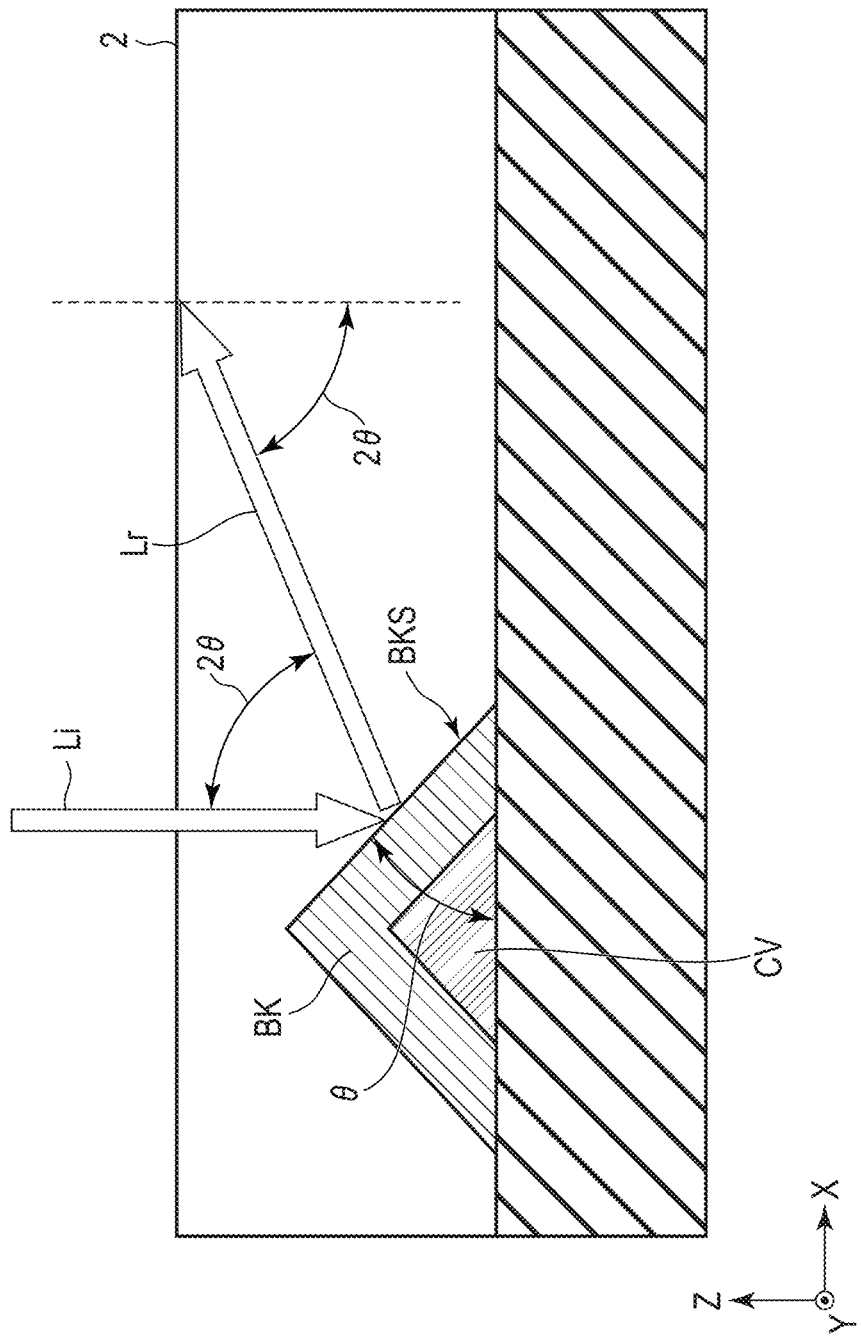
FIG. 13 is a diagram for explaining the angle θ of inclination of an inclined surface BKS.

FIG. 13 is a diagram for explaining the angle θ of inclination of the inclined surface BKS. Here, the display panel 2 is schematically shown. It is assumed that the refractive index n of the entire display panel 2 including the members which are in contact with the black film BK is uniform. When the angle of inclination of the inclined surface BKS with respect to the X-Y plane is θ, the angle between the incident light Li when external light enters the front side of the display panel 2 and the reflected light Lr on the inclined surface BKS is 2θ. When the reflected light Lr is totally reflected on the interface between the display panel 2 and air, the angle of incidence is 2θ.

When the refractive index of air is 1, and the refractive index n of the entire display panel 2 is 1.5, the condition to totally reflect the reflected light Lr inside the display panel 2 is that θ is greater than or equal to approximately 21°. In other words, the angle θ of inclination of the inclined surface BKS should be preferably set so as to be greater than or equal to 21°.

By this configuration, the external light Li which entered the display panel 2 is trapped inside the display panel 2, thereby preventing the external light Li from becoming undesired reflected light.

FIG. 14 is a schematic cross-sectional view of the display panel 2 including a spacer PS and the black film BK.

For example, the spacer PS is located between the color filter CFR and the color filter CFB immediately above the intersection portion of the scanning line G and the signal line S, and is formed into a columnar shape. The spacer PS forms a cell gap for holding the liquid crystal layer LC between the first substrate SUB1 and the second substrate SUB2. In the example shown in the figure, the spacer PS is formed in the first substrate SUB1 such that the distal end is in contact with the second substrate SUB2. As another example, the spacer PS may be formed in the second substrate SUB2 such that the distal end is in contact with the first substrate SUB1.

The black film BK is formed so as to have the inclined surface BKS as described. However, the portion overlapping the spacer PS is flattened. By this configuration, the variation in the call gap is prevented.

Figure 15:
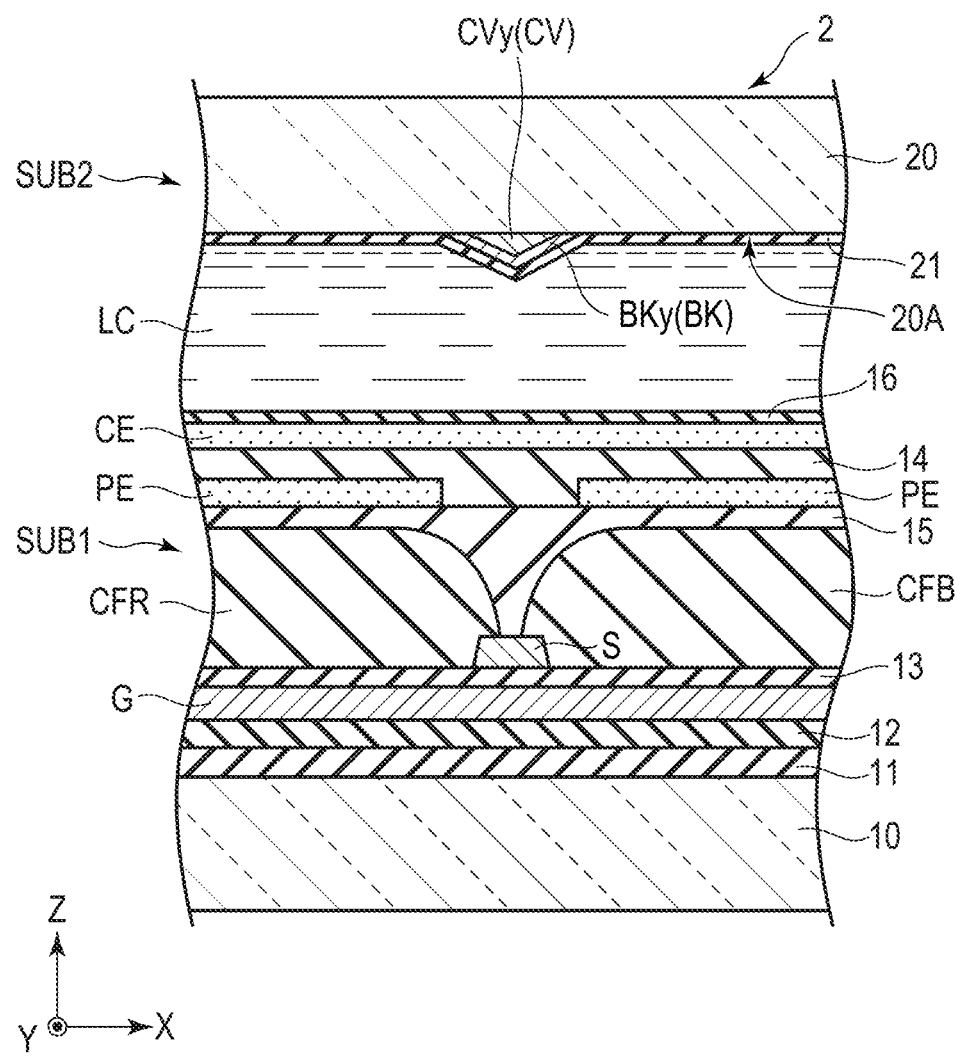
FIG. 15 is a schematic cross-sectional view showing another configuration example of the display panel 2 including the subpixels shown in FIG. 4.

FIG. 15 is a schematic cross-sectional view showing another configuration example of the display panel 2 including the subpixels shown in FIG. 4.

The example shown in FIG. 15 is different from each of the above examples in respect that the black film BK is provided in the second substrate SUB2. Even in a case where the black film BK is provided in the second substrate SUB2, when the display panel 2 is seen in a plan view, in the same manner as the example shown in FIG. 4, the black film BK overlaps the scanning lines and the signal lines. Here, this specification explains a case where the black film BK overlaps the convex portion CV. However, the black film BK may overlap the concave portion CC.

The first substrate SUB1 comprises the insulating substrate 10, the scanning line G, the signal line S, the pixel electrode PE, the common electrode CE, the color filters CFR, CFG and CFB, the insulating films 11 to 15 and the alignment film 16.

The second substrate SUB2 comprises the insulating substrate 20, the convex portion CV, the black film BK and the alignment film 21. In the cross-sectional view in the X-Z plane shown in the figure, the second convex portion CVy is shown as part of the convex portion CV, and the second portion BKy is shown as part of the black film BK. In the cross-sectional view in the Y-Z plane, the first convex portions CVx and the first portions BKx similar to those of the example shown in FIG. 8 are provided in the second substrate SUB2.

The second convex portion CVy is formed on the main surface 20A and overlaps the signal line S. The second portion BKy is located immediately above the signal line S and overlaps the second convex portion CVy. The reflectance of the second portion BKy is less than that of the signal line S. The alignment film 21 covers the black film BK and also covers the main surface 20A.

The liquid crystal layer LC is held between the first substrate SUB1 and the second substrate SUB2.

Even in this configuration example, effects similar to those of the above examples can be obtained.

As explained above, the present embodiment can provide a display device which can prevent the reflection of external light.

All of the display devices that can be implemented by a person of ordinary skill in the art through arbitrary design changes to the display device described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. A display device comprising a first substrate, a second substrate facing the first substrate, and a liquid crystal layer held between the first substrate and the second substrate, wherein
the first substrate comprises:
an insulating substrate comprising a main surface;
a switching element;
a first pixel electrode electrically connected to the switching element;
a second pixel electrode adjacent to the first pixel electrode;
a wiring line provided between the first pixel electrode and the second pixel electrode;
an inorganic insulating film covering the first pixel electrode and the second pixel electrode and provided between the liquid crystal layer and the wiring line;
a common electrode disposed on the inorganic insulating film, facing the first pixel electrode and the second pixel electrode, and provided between the liquid crystal layer and the inorganic insulating film;
a convex portion disposed on the inorganic insulating film, provided between the wiring line and the liquid crystal layer, overlapping the wiring line and extending along the wiring line; and
a black film formed into a belt-like shape overlapping the convex portion, and comprising an inclined surface which inclines with respect to the main surface,
the black film is covered with the common electrode and is electrically connected to the common electrode,
the wiring line is a signal line which supplies a video signal to the switching element, and
a width of the black film is greater than a width of the signal line.

2. The display device of claim 1, wherein
the convex portion and the black film surround the first pixel electrode.

3. A display device comprising a first substrate, a second substrate facing the first substrate, and a liquid crystal layer held between the first substrate and the second substrate, wherein
the first substrate comprises:
an insulating substrate comprising a main surface;
a switching element;
a first pixel electrode electrically connected to the switching element;
a second pixel electrode adjacent to the first pixel electrode;
a wiring line provided between the first pixel electrode and the second pixel electrode;
an inorganic insulating film covering the first pixel electrode and the second pixel electrode and provided between the liquid crystal layer and the wiring line;
a common electrode disposed on the inorganic insulating film, facing the first pixel electrode and the second pixel electrode, and provided between the liquid crystal layer and the inorganic insulating film;
a concave portion provided between the wiring line and the liquid crystal layer, overlapping the wiring line and extending along the wiring line; and
a black film formed into a belt-like shape overlapping the concave portion, and comprising an inclined surface which inclines with respect to the main surface,
the black film is covered with the common electrode and is electrically connected to the common electrode,
the wiring line is a signal line which supplies a video signal to the switching element, and
a width of the black film is greater than a width of the signal line.

4. The display device of claim 3, wherein
the concave portion and the black film surround the first pixel electrode.

5. The display device of claim 1, wherein
the black film is a conductive film, and
a reflectance of the black film is less than a reflectance of the wiring line.

6. The display device of claim 3, wherein
the black film is a conductive film, and
a reflectance of the black film is less than a reflectance of the wiring line.

7. The display device of claim 1, wherein
the first substrate further comprises:
a first color filter provided between the insulating substrate and the first pixel electrode; and
a second color filter provided between the insulating substrate and the second pixel electrode, and
the black film overlaps a boundary between the first color filter and the second color filter.

8. The display device of claim 1, further comprising:
an illumination device facing the first substrate; and
an optical magnification system facing the second substrate.

9. The display device of claim 3, wherein
the first substrate further comprises:
a first color filter provided between the insulating substrate and the first pixel electrode; and
a second color filter provided between the insulating substrate and the second pixel electrode, and
the black film overlaps a boundary between the first color filter and the second color filter.

10. The display device of claim 3, further comprising:
an illumination device facing the first substrate; and
an optical magnification system facing the second substrate.

11. A display device comprising:
a display panel;
an illumination device configured to illuminate the display panel; and
an optical magnification system facing the display panel, wherein
the display panel comprises:
a first substrate:
a second substrate facing the first substrate; and
a liquid crystal layer held between the first substrate and the second substrate,
the first substrate comprises:
an insulating substrate comprising a main surface;
a first pixel electrode;
a second pixel electrode adjacent to the first pixel electrode;
a black film provided between the first pixel electrode and the second pixel electrode in plan view, formed into a belt-like shape and comprising an inclined surface which inclines with respect to the main surface;
a first color filter provided between the insulating substrate and the first pixel electrode, a second color filter provided between the insulating substrate and the second pixel electrode and spaced from the first color filter; and an organic insulating film covering the first color filter and the second color filter and filled in a gap between the first color filter and the second color filter, and the black film overlaps the gap between the first color filter and the second color filter.

12. The display device of claim 11, further comprising a common electrode facing the first pixel electrode and the second pixel electrode, wherein the black film is a conductive film electrically connected to the common electrode.

13. The display device of claim 11, wherein the black film overlaps a convex portion.

14. The display device of claim 11, wherein the black film overlaps a concave portion.

* * * * *